United States Patent [19]

Chen et al.

[11] Patent Number: 5,510,287
[45] Date of Patent: Apr. 23, 1996

[54] METHOD OF MAKING VERTICAL CHANNEL MASK ROM

[75] Inventors: Ling Chen, Sunnyvale, Calif.; Sung-Mu Hsu, I-Lan; Liang F. Weng, Hsin-Chu, both of Taiwan

[73] Assignee: Taiwan SemiConductor Manuf. Company, Hsinchu, Taiwan

[21] Appl. No.: 332,908

[22] Filed: Nov. 1, 1994

[51] Int. Cl.$^6$ ............................................. H01L 21/8246
[52] U.S. Cl. ................... 437/52; 437/45; 437/48; 437/89
[58] Field of Search ................... 437/45, 48, 52, 437/89; 257/302, 329–333, 390, 391

[56] References Cited

U.S. PATENT DOCUMENTS

| | | | |
|---|---|---|---|
| 4,554,570 | 11/1985 | Jastrzebski | 257/332 |
| 4,984,030 | 1/1991 | Sunami | 251/302 |
| 5,081,052 | 1/1992 | Kobayashi et al. | 257/390 |
| 5,208,172 | 5/1993 | Fitch et al. | 437/89 |
| 5,244,824 | 9/1993 | Sivan | 437/52 |

*Primary Examiner*—Tom Thomas
*Attorney, Agent, or Firm*—George O. Saile; Jerry Jones

[57] ABSTRACT

A device and a method of manufacture of a semiconductor device on a semiconductor substrate is provided. An N+ source layer is formed on the surface of the semiconductor substrate. A dielectric layer is formed on the surface of the source layer. The dielectric layer is patterned and etched forming a dielectric layer pattern with openings therein, a silicon epitaxial layer in the openings in the dielectric layer pattern. An N+ drain layer is formed on the surface of the silicon epitaxial layer. A second dielectric layer is formed on the surface of the device including the N+ drain layer. A conductor layer is formed and patterned containing silicon over the second dielectric layer. An N+ implant mask with an N+ opening over a region of the epitaxial layer is formed (source) and ion implanting through that N+ opening into the N+ implant mask in that region. A code implant mask over the conductor layer is formed and ions are implanted through the code implant mask into the device.

19 Claims, 4 Drawing Sheets

5,510,287

METHOD OF MAKING VERTICAL CHANNEL MASK ROM

BACKGROUND OF THE INVENTION

1. Field of the Invention

This invention relates to semiconductor memory devices and more particularly to vertical ROM devices.

2. Description of Related Art

U.S. Pat. No. 5,244,824 of Sivan for "Trench Capacitor and Transistor Structure and Method for Making the Same" shows a vertical channel memory cell for a DRAM.

Current flat type cells need to use a virtual ground technique to reduce effective cell size. Some problems with using such a virtual ground technique are as follows:

1) increase in chip size due to extra decoder circuits required for the virtual ground technique.
2) slower speed results from the additional delays caused by extra decoder circuits.

SUMMARY OF THE INVENTION

An object of this invention is to eliminate the need for a virtual ground technique while maintaining the same cell size as a flat cell for the same layout rule.

In accordance with this invention a method is provided for manufacture of a semiconductor device on a semiconductor substrate. The following sequence of steps is employed. Form an N+ source layer on the surface of the semiconductor substrate. Form a dielectric layer on the surface of the source layer. Pattern and etch the dielectric layer forming a dielectric layer pattern with openings therein. Form a silicon epitaxial layer in the openings in the dielectric layer pattern. Form an N+ drain layer on the surface of the silicon epitaxial layer. Form a second dielectric layer on the surface of the device including the N+ drain layer. Form and pattern a conductor layer containing silicon over the second dielectric layer. Form an N+ implant mask with an N+ opening over a region of the epitaxial layer (source) and ion implanting through that N+ opening into the N+ implant mask in that region. Form a code implant mask over the conductor layer. Ion implant through the code implant mask into the device.

The following are preferred features of the invention. The conductor layer comprises a material selected from polysilicon and a polycide selected from the group consisting of $WSi_2$, $TiSi_2$, $CoSi_2$, $MoSi_2$, and $TaSi_2$. A dose of boron ions is implanted through the code implant mask into the device. The dose comprises boron ions implanted within the range from about 1E13 $cm^{-2}$ to about 5 E14 $cm^{-2}$. The dose can be applied at from about 100 keV to about 200 keV. Form an N+ drain layer on the surface of the silicon dielectric layer is performed by ion implant of an N+ dopant, or by thermal deposition and annealing. Form an N+ source layer on the surface of the semiconductor substrate by ion implanting of N+ dopant, preferably arsenic, within the range from 1 E15 $cm^{-2}$ to 8 E15 $cm^{-2}$. Form an N+ drain layer on the surface of the silicon dielectric layer by thermal diffusion or by ion implanting an N− dopant which can be performed by implanting arsenic ions.

BRIEF DESCRIPTION OF THE DRAWINGS

The foregoing and other aspects and advantages of this invention are explained and described below with reference to the accompanying drawings, in which:

FIG. 5 shows the device of FIG. 4 subsequent to an etching step which removes the remainder of silicon dioxide layer followed by a conventional gate oxide process, and formation of.

DESCRIPTION OF THE PREFERRED EMBODIMENT

This invention provides a new vertical channel memory cell technology employing an epitaxial process for growing a vertical channel. The cell is especially well adapted for use as a Mask ROM and is also adapted to use in other kinds of memories and repeated arrays.

Figure 1:
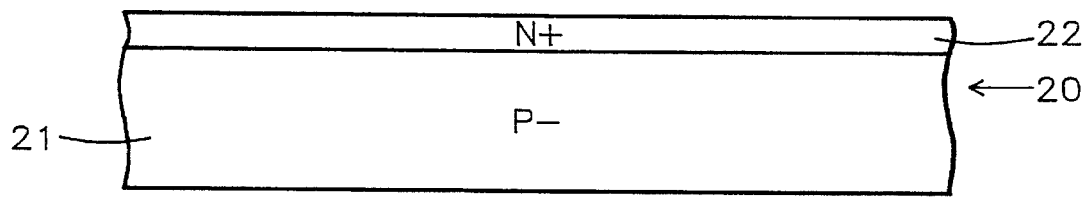
FIG. 1 shows a device in the early stages of manufacture comprising a P− silicon substrate on the surface of which an N+ source region has been formed by either one of two processes comprising thermal diffusion or ion implantation.

FIG. 1 shows a device 20 in the early stages of manufacture comprising a P− silicon substrate 21 on the surface of which an N+ source region 22 has been formed by either one of two processes comprising:

1) thermal diffusion of arsenic, antimony or phosphorous, or
2) ion implantation of arsenic, antimony or phosphorous with energy at a level from about 60keV to about 120keV, with a dose of 1 E15 $cm^{-2}$ to about 8 E15 $cm^{-2}$ and then thermally annealed.

It should be noted that substrate 21 can be an N− silicon substrate.

Figure 2:
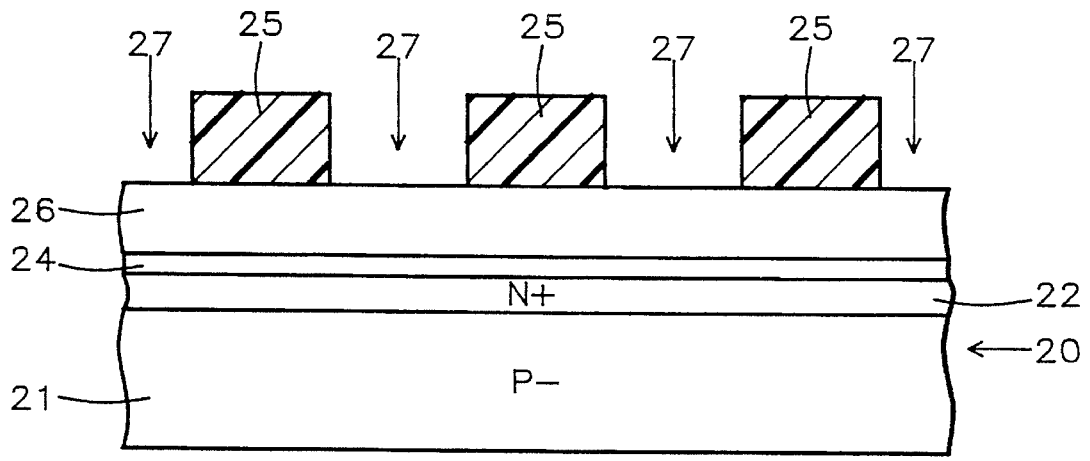
FIG. 2 shows the device of FIG. 1 with a blanket thermally grown, dielectric, silicon dioxide (thermal oxide) layer formed upon which a mask is then formed.

FIG. 2 shows the device of FIG. 1 with a blanket thermally grown, dielectric, silicon dioxide (thermal oxide) layer 24 formed having a thickness of from about 100 Å to about 1000 Å by a process selected from the following:

1) dry or steam thermal oxidation at a temperature from 800° C. to 1,000° C.,
2) any chemical vapor deposition (CVD) process for forming silicon dioxide, or
3) a combination of 1) or 2) above with a preference for thermal oxidation.

Next, a blanket, dielectric, silicon dioxide (oxide) layer 26 having a thickness of from about 2,000 Å to about 9,000 Å, which is formed by the process of 1) steam thermal oxidation at a temperature from 800° C. to 1,000° C.,
2) any chemical vapor deposition (CVD) process of forming silicon oxide, or
3) a combination of 1) or 2) above.

Then a blanket photoresist layer 25 is deposited. Next, photoresist layer 25 is formed by exposure through a photolithographic drain mask and development of layer 25 forming a drain pattern having openings 27, as shown.

In the next step using openings 27 in mask layer 25, an etching process follows using plasma etching of silicon dioxide layers 24 and 26 through openings 27. The plasma dry etching process uses chemicals such as $CF_4$, $C_2F_6$,..., etc. which are well known by those skilled in the art to etch silicon oxide.

Figure 3:
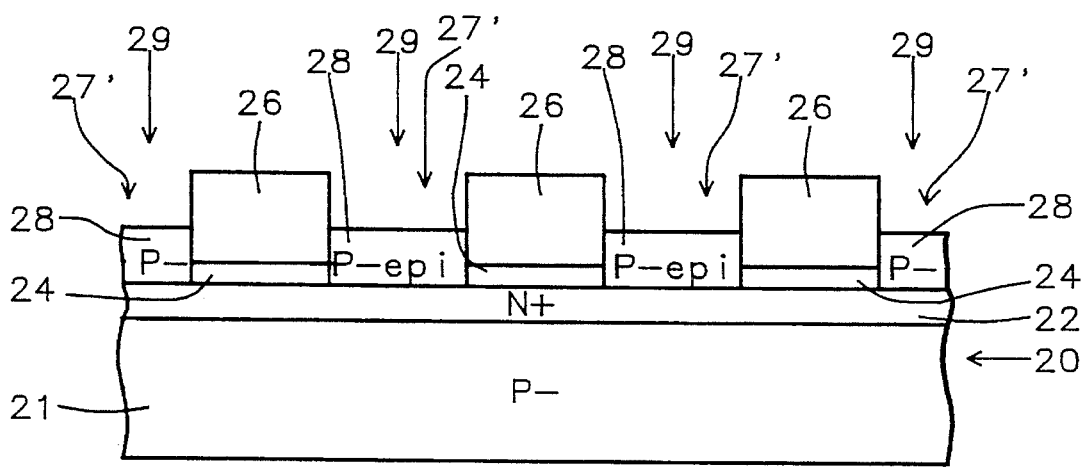
FIG. 3 shows the device of FIG. 2 after etching through openings in the mask leaving stacks of thermal "oxide" layer on the bottom and "oxide" layer on the top, between which are newly grown silicon epitaxial regions.

The etching through openings 27 forms openings 27' as shown in FIG. 3. Then the mask 25 is removed from the device 20 after the etching process described above leaving with the stacks of thermal "oxide" layer 24 on the bottom and "oxide" layer 26 on top.

Between the stacks of thermal "oxide" layer 24 and "oxide" layer 26 are grown silicon epitaxial regions 28. The preferred process for growing regions 28 is silicon epitaxial growth with $SiH_2Cl_2$ ($H_2$ can be added) within a temperature range from 800° C. to 1,100° C. Alternatively one can use $SiH_4$, $SiHCl_3$, or $SiCl_4+H_2$ within the same temperature range.

The epitaxial silicon regions 28 are doped with a P-type dopant by ion implantation with boron ions 29 applied with a dose of about 5 E 11 $cm^{-2}$ to about 5 E 13 $cm^{-2}$. It is implanted at an energy of from about 50 keV to about 100 keV in a high current implanter type of tool. The epitaxial silicon regions 28 can also be doped with boron during epitaxial growth with the use of dopant gas such as $BBr_3$ or $BH_3$ to a level to about 4 E 16 $cm^{-3}$ to about 7 E 17 $cm^{-3}$, or both methods can be applied.

Figure 4:
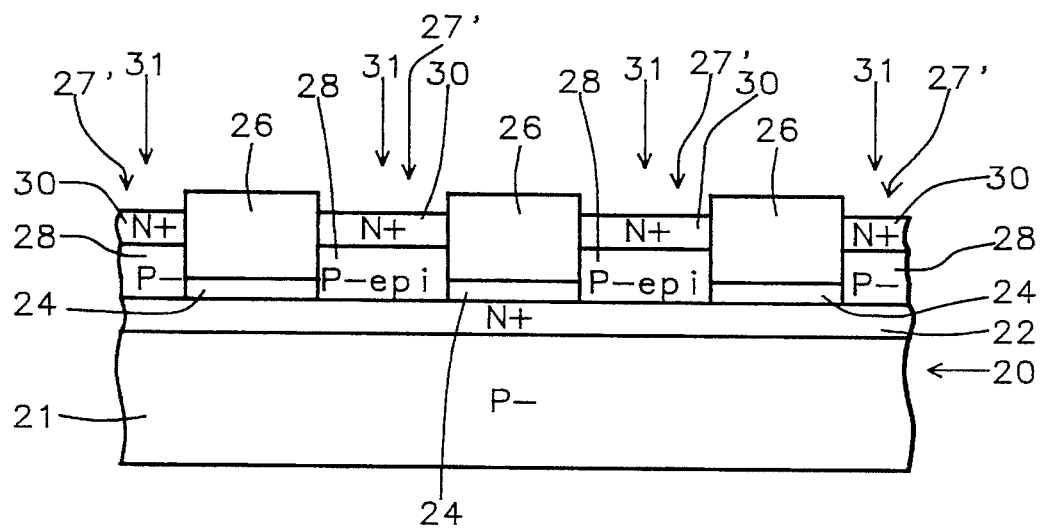
FIG. 4 shows the device of FIG. 3 subsequent to formation of N+ drains 30.

Next, as shown in FIG. 4, the device of FIG. 3 is shown subsequent to formation of N+ drains 30. Drains 30 are formed by one of two preferred processes.

One process is N+ dopant implantation in which drains 30 are doped with a N+ dopant by ion implantation with N ions 31 composed of a dopant of arsenic, antimony or phosphorous applied with a dose of from about 1 E15 $cm^{-2}$ to about 6 E15 $cm^{-2}$. It is implanted at an energy of from about 40 keV to about 80 keV in a high current implanter type of tool. The preferred chemical species of the dopant implanted is arsenic with a dose of from about 2 E15 $cm^{-2}$ to about 4 E15 $cm^{-2}$, at an energy of from about 40 keV to about 60 keV.

Alternatively, the N+ drains 30 are formed by thermal deposition and diffusion of arsenic or phosphorus or antimony from gas sources of $ArH_3$, $PH_3$ or any other appropriate sources known to those skilled in the art. The sheet resistance of this N+ drain can be in the range from 30 ohms/square to 100 ohms/square. The N+ dopant layer will be in the range of 0.15 μm to 0.3 μm thickness which is related to the vertical channel length of the ROM cell (from bottom of N+ drain to the top of the N+ source.)

Figure 5:
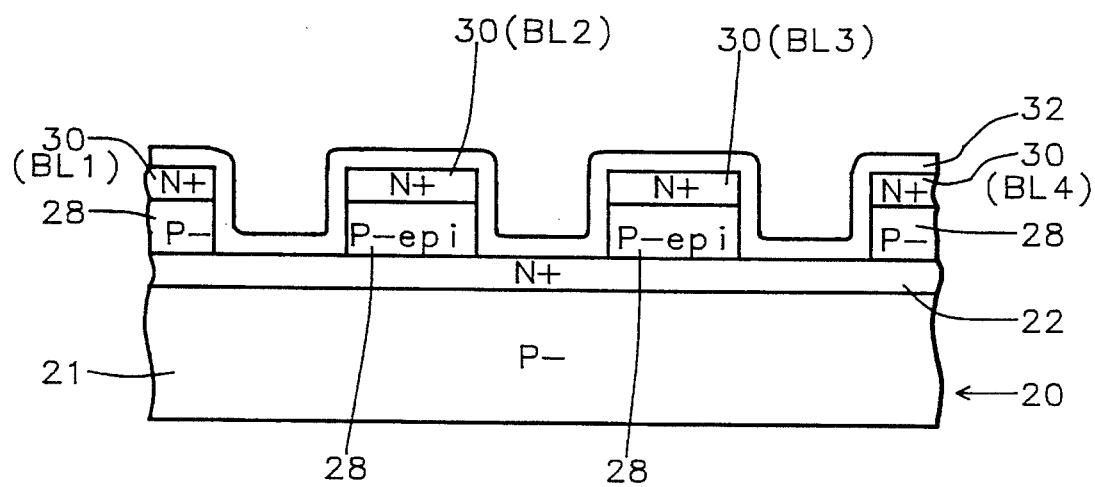

FIG. 5 shows the device of FIG. 4 subsequent to an etching step which removes the remainder of silicon dioxide layers 24 and 26 through openings 27' is performed using BOE (buffered oxide etchant) or HF wet etching.

Next, a conventional gate oxide process is performed to form gate oxide layer 32 on the newly exposed surfaces of N+ source region 22 and over the remained of the device as a blanket layer by the process of thermal oxidation dry or with steam.

Figure 6:
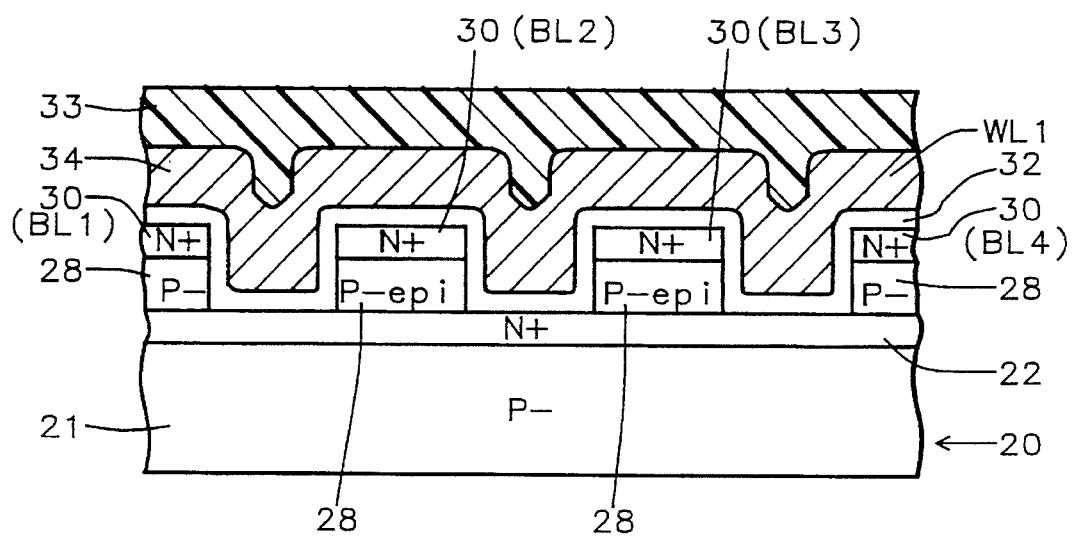
FIG. 6 shows the device of FIG. 5 after a polycide (silicon containing), word line (WL1) conductor layer 34 is deposited and patterned into word line conductors.

Then as shown in FIG. 6, a polycide (silicon containing), word line (WL1) conductor layer 34 is deposited having a thickness of from about 2,000Å to about 4,000Å, composed of a material selected from the group of polycide materials consisting of $WSi_2$, $TiSi_2$, $CoSi_2$, $MoSi_2$, and $TaSi_2$. For example, $WSi_2$ can be formed from CVD of $WF_6$ and $SiH_4$ or $SiH_2Cl_2$, $TiSi_2$ can be formed from sputtering Ti on polysilicon and then annealed. Polysilicon can be used as a substitute or both can be used.

The word line (WL1) conductor layer 34 is patterned to provide transverse word lines across the top of the structure in accordance with the state of the art by applying and patterning a mask 33. The mask is composed of photoresist and is patterned photolithographically by exposure and development. Then the patterned mask 33 is employed to etch away the unwanted portions of layer 34 leaving the word lines, such as word lines WL1 behind.

Contact Formation

Figure 7:
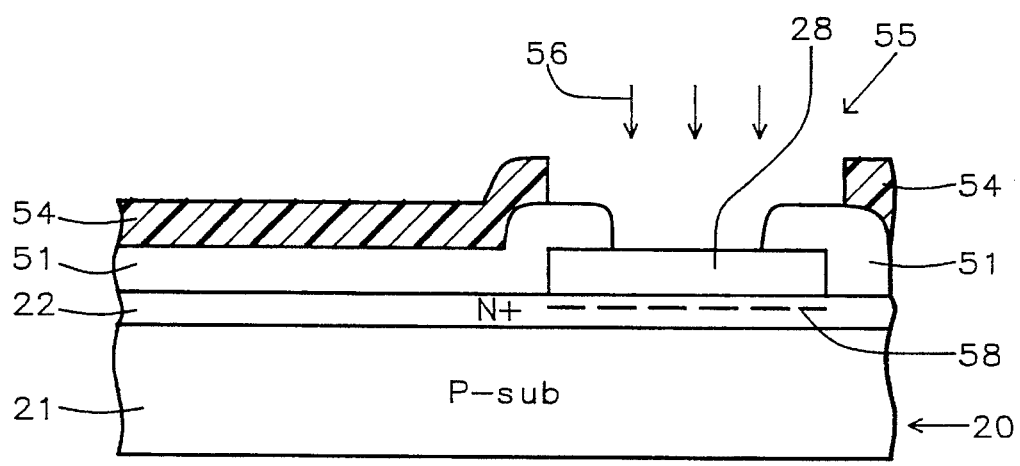
FIG. 7 shows a sectional view of the device of FIG. 6 taken through a source N+ interconnect structure where contact between metallization and the source layer is to be formed by ion implantation of a contact region of the source layer with N+ boron ions.

For source N+ interconnect through contact and metal, a mask 54 has been formed to define an area into which to make a contact implant 58 into N+ common source region 22 area as shown in FIG. 7. The N+ implanted region 58 is adapted for connect to interconnect metallization to N+ common source region 22. ILD layer 51 is patterned photolithographically to form a contact implant mask 54 with opening 55 for making the implant into source region 22 below the P-epi region 28 which is the channel area of a ROM cell. To form photomask 54 to pattern ILD layer 51, the device 20 is covered with photoresist 54 over interlayer dielectric (ILD) layer 51, which has been formed over this region of the device 20. There is an opening 55 through ILD layer 51 down to P-epi region 28. The ILD layer 51 is preferably composed of BPSG.

Next, as indicated above, the N+ source region 22 is doped by ion implantation with N+ phosphorus or arsenic ions 56 applied with a dose of from about 1 E 15 $cm^{-2}$ to about 6 E 15 $cm^{-2}$. It is implanted at an energy of from about 180 keV to about 300 keV in a high current implanter type of tool. The preferred chemical species of the dopant implanted is phosphorus ions 56 applied with a dose of from about 1 E 15 $cm^{-2}$ to about 6 E 15 $cm^{-2}$ implanted at an energy of from about 180 keV to about 300 keV.

Later a contact is opened above implanted region 58 for forming the metal interconnection. Neither does the mask 54 and N+ implanted areas need to be very large nor do many areas need to be implanted if effective source N+ resistance is small enough. Thus die size is saved. Also, this mask and implant should happen before formation of the code mask and code implanting.

Code Implanting

Figure 8:
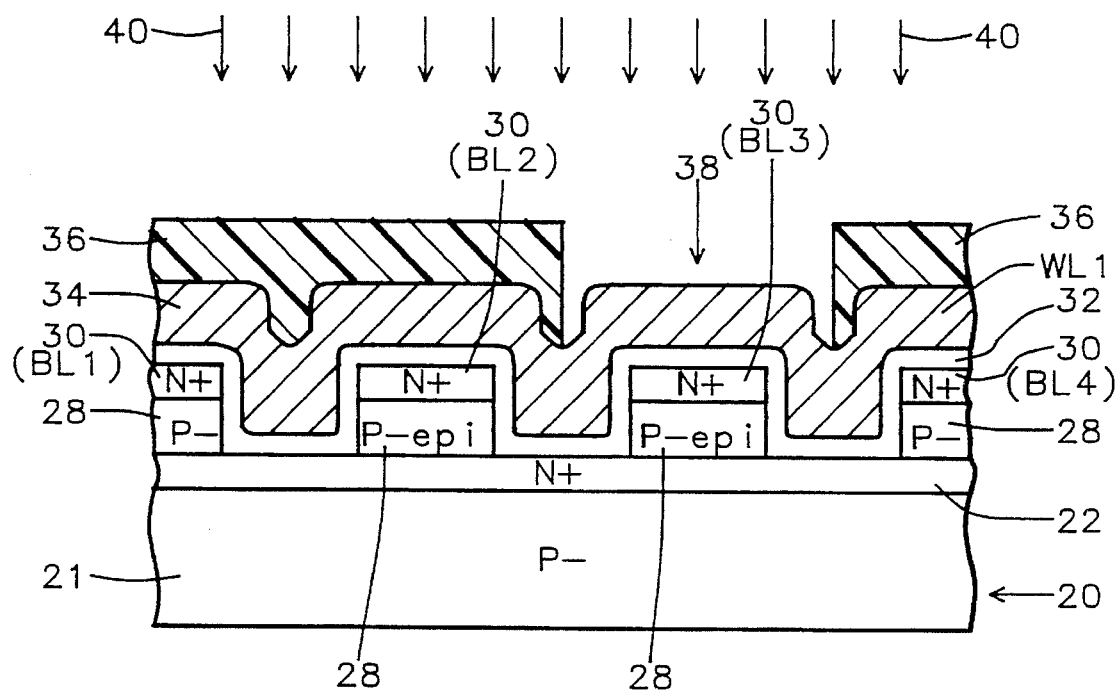
FIG. 8 shows the device of FIG. 6 covered with a photoresist mask to form a source P-epi code implant mask for making a code implant into channels below and onto the P-epi region which is the channel area of a ROM cell.

Then, as shown in FIG. 8, the device of FIG. 6 is covered with photoresist layer 36 which is patterned photolithographically to form a source P-epi code implant mask 36 with a code implant opening 38 for making a code implant into the P-epi region 28 which is the channel area of a ROM cell. Below N+ region 30 and P-epi region 28 is N+ doped source region 22.

The P-epi region 22 is doped by ion implantation with N+ ions 40 composed of a dopant of boron applied with a dose from about 1×E 13 $cm^{-2}$ to about 5 E 14 $cm^{-2}$. It is implanted at an energy of from about 100 keV to about 200 keV in a high current implanter type of tool.

Figure 9:
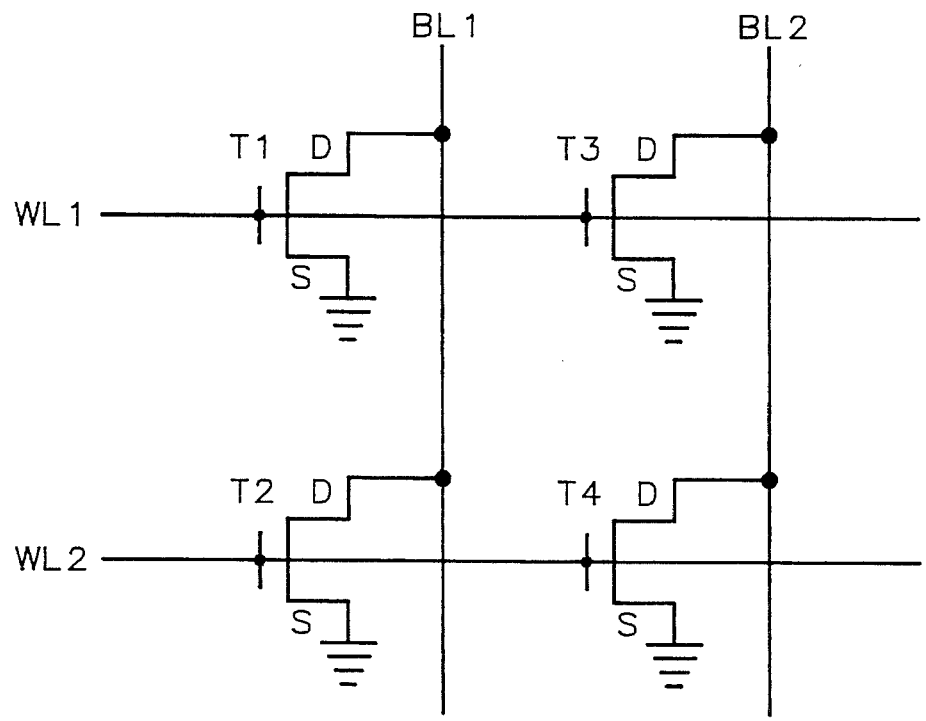
FIG. 9 shows an electrical schematic diagram of a device in accordance with this invention.

FIG. 9 shows an electrical schematic diagram of a ROM array in accordance with this invention including four FET transistors. Two of those FET transistors T1 and T3 have their gates connected to word line WL1. The other two FET transistors T2 and T4 have their gates connected to word line WL2. The transistors T1 and T2 have their drains connected to bit line BL1; and transistors T3 and T4 have their drains connected to bit line BL2. Transistors T1, T2, T3 and T4 have their sources connected together in a common reference potential.

Summary

Advantages of this invention include as follows:
1) Double channels are provided for each cell.
2) There are common sources so there is as follows:
   a) No need of a virtual ground technique.
   b) No need of decoding source lines.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A method of manufacture of a semiconductor device on a P– silicon semiconductor substrate having a surface comprising
   a) forming an N+ source region layer on the surface of said semiconductor substrate, said N+ source layer having an exposed surface,
   b) forming a dielectric layer on the surface of said source region layer,
   c) patterning and etching said dielectric layer forming a first dielectric layer pattern with openings therein down to said exposed surface of said N+ source layer,
   d) forming a silicon epitaxial channel layer in said openings in said first dielectric layer pattern, said silicon epitaxial channel layer having exposed surfaces and doping said epitaxial layer with a P– dopant,
   e) forming an N+ drain layer on the surface of said silicon epitaxial layer to form drain regions over the remainder of said silicon epitaxial layer by doping with an N+ dopant,
   f) removing said dielectic layer and then forming a second dielectric layer on the surface of said device including said N+ drain layer,
   g) forming and patterning a conductor layer containing silicon over said second dielectric layer,
   h) forming an N+ implant mask with an N+ opening over a region of said epitaxial channel layer and ion implanting through said N+ opening in said implant mask into said region,
   i) forming a code implant mask over said conductor layer, and
   j) ion implanting through said code implant mask into the device.

2. The method of claim 1 wherein said conductor layer comprises a material selected from the group consisting of polysilicon and a polycide selected from the group consisting of $WSi_2$, $TiSi_2$, $CoSi_2$, $MoSi_2$, and $TaSi_2$.

3. The method of claim 1 wherein said ion implanting through said code implant mask into the device employs a dose of boron.

4. The method of claim 3 wherein said dose comprises boron ions implanted within the range from about 1E13 $cm^{-2}$ to about 5E14 $cm^{-2}$.

5. The method of claim 4 wherein forming an N+ source layer on the surface of said semiconductor substrate is performed by an arsenic ion implant.

6. The method of claim 4 wherein said dose is applied at from about 100 keV to about 200 keV.

7. The method of claim 6 wherein forming an N+ drain layer on the surface of said silicon epitaxial layer is performed by ion implant of an N– dopant.

8. The method of claim 4 wherein forming an N+ drain layer on the surface of said silicon dielectric layer is formed by ion implanting of an N– dopant.

9. The method of claim 4 wherein forming an N+ drain layer on the surface of said silicon epitaxial layer is performed by thermal deposition from a source of a dopant selected from the group consisting of of arsenic and phosphorous and antimony into said silicon dielectric layer and annealing.

10. The method of claim 4 wherein forming an N+ source layer on the surface of said semiconductor substrate is performed by an arsenic ion implant.

11. The method of claim 5 wherein forming an N+ drain layer on the surface of said silicon epitaxial layer is performed by ion implant of an N– dopant.

12. The method of claim 6 wherein forming an N+ drain layer on the surface of said silicon epitaxial layer is performed by thermal deposition and diffusion of a material selected from arsenic, phosphorus and antimony.

13. The method of claim 6 wherein forming an N+ source layer on the surface of said semiconductor substrate is performed by an arsenic ion implant.

14. A method of manufacture of a semiconductor device on a P– silicon semiconductor substrate having a surface comprising
   a) forming an N+ source region layer on the surface of said semiconductor substrate, said N+ source layer having an exposed surface,
   b) forming a dielectric layer on the surface of said source region layer,
   c) patterning and etching said dielectric layer forming a, first dielectric layer pattern with openings therein down to said exposed surface of said N+ source region layer,
   d) forming a silicon epitaxial channel layer in said openings in said first dielectric layer pattern, said silicon epitaxial channel layer having exposed surfaces and being doped with a P– dopant,
   e) forming an N+ drain layer on the surface of said silicon epitaxial layer to form drain regions over the remainder of said silicon epitaxial layer by doping with an N+ dopant,
   f) removing said dielectric layer and then forming a second dielectric layer on the surface of said device including said N+ drain layer,
   g) forming and patterning a conductor layer containing silicon over said second dielectric layer,
   h) forming an N+ opening over a region of said epitaxial channel layer and ion implanting through said N+ opening in said implant mask into said region,
   i) forming a code implant mask over said conductor layer, and
   j) ion implanting through said code implant mask into the device.

15. The method of claim 14 wherein said conductor layer comprises a material selected from the group consisting of polysilicon and a polycide selected from the group consisting of $WSi_2$, $TiSi_2$, $CoSi_2$, $MoSi_2$, and $TaSi_2$.

16. The method of claim 15 wherein said ion implanting through said code implant mask into the device employs a dose of boron.

17. The method of claim 16 wherein said dose comprises boron ions implanted within the range from about 1E13 $cm^{-2}$ to about 5E14 $cm^{-2}$, said dose being applied at from about 100 keV to about 200 keV.

18. The method of claim 17 wherein forming an N+ drain layer on the surface of said silicon dielectric layer is formed by ion implanting of an N+ dopant.

19. The method of claim 17 wherein forming an N+ drain layer on the surface of said silicon epitaxial layer is performed by thermal deposition from a source of a dopant selected from the group consisting of of arsenic and phosphorous and antimony into said silicon dielectric layer and annealing.

* * * * *

UNITED STATES PATENT AND TRADEMARK OFFICE
CERTIFICATE OF CORRECTION

PATENT NO. : 5,510,287
DATED : April 23, 1996
INVENTOR(S) : Ling Chen
Sung-Mu Hsu
Liang F. Weng It is certified that error appears in the above-indentified patent and that said Letters Patent is hereby corrected as shown below: Title page:

Item [75], correct inventor's name from "Liang F. Weng" to --Weng Liang Fang--

Signed and Sealed this

Fifth Day of November, 1996

Attest:

BRUCE LEHMAN

*Attesting Officer*     *Commissioner of Patents and Trademarks*